(12) United States Patent
Grange et al.

(10) Patent No.: US 7,569,152 B2
(45) Date of Patent: Aug. 4, 2009

(54) METHOD FOR SEPARATING A USEFUL LAYER AND COMPONENT OBTAINED BY SAID METHOD

(75) Inventors: Hubert Grange, Grenoble (FR); Bernard Diem, Echirolles (FR); Sylvie Viollet Bosson, Vif (FR); Michel Borel, Saint Vincent de Mercuze (FR)

(73) Assignee: Commissariat a l'Energie Atomique, Paris (FR)

( * ) Notice: Subject to any disclaimer, the term of this patent is extended or adjusted under 35 U.S.C. 154(b) by 727 days.

(21) Appl. No.: 10/562,931

(22) PCT Filed: Jul. 1, 2004

(86) PCT No.: PCT/FR2004/001699

§ 371 (c)(1),
(2), (4) Date: Dec. 30, 2005

(87) PCT Pub. No.: WO2005/012160

PCT Pub. Date: Feb. 10, 2005

(65) Prior Publication Data

US 2006/0144816 A1    Jul. 6, 2006

(30) Foreign Application Priority Data

Jul. 4, 2003    (FR) .................................. 03 08157

(51) Int. Cl.
*C03C 15/00*    (2006.01)
(52) U.S. Cl. .............................. 216/12; 216/57; 216/62
(58) Field of Classification Search ........................ None
See application file for complete search history.

(56) References Cited

U.S. PATENT DOCUMENTS

| | | | | |
|---|---|---|---|---|
| 4,662,746 A | * | 5/1987 | Hornbeck | .................... 359/223 |
| 4,783,237 A | * | 11/1988 | Aine et al. | ..................... 438/52 |
| 5,489,556 A | | 2/1996 | Li et al. | |
| 5,510,276 A | * | 4/1996 | Diem et al. | .................... 438/53 |
| 5,750,420 A | | 5/1998 | Bono et al. | |
| 5,771,321 A | * | 6/1998 | Stern | ........................... 385/31 |
| 5,824,608 A | | 10/1998 | Gotoh et al. | |
| 5,912,499 A | * | 6/1999 | Diem et al. | ................. 257/419 |
| 5,914,507 A | * | 6/1999 | Polla et al. | ................... 257/254 |
| 6,004,832 A | | 12/1999 | Haller et al. | |

(Continued)

FOREIGN PATENT DOCUMENTS

EP    0 456 029 A1    11/1991

OTHER PUBLICATIONS

Alley et al., "The Effect of Release-Etch Processing on Surface Microstructure Stiction," Solid-State Sensor and Actuator Workshop, 5th Technical Digest, IEEE Hilton, pp. 202-207, 1992.

*Primary Examiner*—Allan Olsen
(74) *Attorney, Agent, or Firm*—Oliff & Berridge, PLC

(57) ABSTRACT

A useful layer (1) is initially attached by a sacrificial layer (2) to a layer (3) forming a substrate. Before etching of the sacrificial layer (2), at least a part of the surface (4, 5) of at least one of the layers in contact with the sacrificial layer (2) is doped. After etching of the sacrificial layer (2), the surface (4, 5) is superficially etched so as to increase the roughness of its doped part. After doping, a mask (9) is deposited on a part of the useful layer (1) so as to delineate a doped zone and a non-doped zone of the surface (4, 5), one of the zones forming a stop after the superficial etching phase.

12 Claims, 4 Drawing Sheets

U.S. PATENT DOCUMENTS

| | | | |
|---|---|---|---|
| 6,071,752 A * | 6/2000 | Furlani et al. | 438/52 |
| 6,181,460 B1 * | 1/2001 | Tran et al. | 359/291 |
| 7,172,911 B2 * | 2/2007 | Kalvesten et al. | 438/29 |
| 2002/0096717 A1 * | 7/2002 | Chu et al. | 257/347 |
| 2002/0117728 A1 * | 8/2002 | Brosnihan et al. | 257/446 |
| 2003/0138986 A1 * | 7/2003 | Bruner | 438/52 |
| 2006/0065909 A1 * | 3/2006 | Wong et al. | 257/192 |
| 2006/0068563 A1 * | 3/2006 | Wong et al. | 438/455 |
| 2007/0042521 A1 * | 2/2007 | Yama | 438/48 |
| 2007/0062280 A1 * | 3/2007 | Jakobsen | 73/504.04 |

* cited by examiner

METHOD FOR SEPARATING A USEFUL LAYER AND COMPONENT OBTAINED BY SAID METHOD

BACKGROUND OF THE INVENTION

The invention relates to a method for separating a useful layer, initially attached by a sacrificial layer to a layer forming a substrate, method comprising
- at least partial etching of the sacrificial layer,
- doping, before etching of the sacrificial layer, of at least a part of the surface of at least one of the layers in contact with the sacrificial layer and,
- after etching of the sacrificial layer, a superficial etching phase of said surface so as to increase the roughness of the doped part of the surface.

STATE OF THE ART

Certain micromechanical components, for example actuators or accelerometers, comprise a suspended useful layer, attached by fixing means to a substrate. The distance between the useful layer and the substrate can be in the region of or less than one micron. In this case, the component is generally fabricated by means of a sacrificial layer enabling the distance between the useful layer and the substrate to be monitored. As represented in FIG. 1, the useful layer 1 is initially attached by the sacrificial layer 2 to a layer forming a substrate 3. When fabrication takes place, the sacrificial layer 2 is at least partially etched to obtain a suspended structure.

Etching is typically performed by liquid chemical means, possibly followed by rinsing. After etching and rinsing, the component is dried and capillary forces may attract the useful layer 1 towards the substrate 3 thus causing sticking of their opposite surfaces 4 and 5, which makes the component unusable. Other forces, for example electrostatic forces or Van der Waals forces, may also lead to sticking of the surfaces 4 and 5.

In FIG. 2, sticking of the surfaces 4 and 5 is prevented by stops 6 and 7, respectively securedly affixed to the surfaces 4 and 5 and keeping the two surfaces 4 and 5 at a distance. The document U.S. Pat. No. 5,750,420 describes a method for fabricating such a structure, wherein the useful layer 1 is kept at a distance from the substrate 3 by stops 6 and 7. It comprises partial etching of the sacrificial layer 2, leaving a spacer block 8 with a width of about one micron, then partial etching of the useful layer 1 so as to form the stops 6 and 7, and then etching to eliminate the spacer block 8. This method thus requires three etching steps, the first of which is difficult to master. The arrangement of the spacer block 8, and consequently of the stops, is determined by etching fronts propagating from lateral orifices 11.

The article "The effect of release-etch processing on surface microstructure stiction" by R. L. Alley et al. (Solid-State Sensor and Actuator Workshop, $5^{th}$ Technical Digest, 22 Jun. 1992, pages 202-207) describes a method enabling microstructures to be released by etching and mentions that the surface roughness enables the separation between surfaces to be increased. A suspended structure, initially attached by a sacrificial layer to a highly doped substrate, is released by etching of the sacrificial layer, for example using hydrofluoric acid. The substrate can be formed by an n-doped material or by a p-doped material, for example by a method using $B_2O_3$. The suspended structure comprises a polysilicon layer doped with nitrogen for one hour at 1050° C. After etching of the sacrificial layer, the n-doped polysilicon is much rougher than an amorphous material used in a comparison test.

The document U.S. Pat. No. 6,004,832 describes a method for fabricating a nitride layer suspended on a conducting substrate. The nitride layer is first deposited on an insulating layer that is at least partially etched. Then the surface of the substrate, formed by a highly doped material, is made rough by chemical means, for example using potassium hydroxide (KOH).

OBJECT OF THE INVENTION

It is an object of the invention to remedy the shortcomings of known methods and, more particularly, to prevent sticking of the useful layer and of the substrate, while simplifying the fabrication method.

According to the invention, this object is achieved by the accompanying claims and, more particularly, by the fact that the method comprises deposition, before doping, of a mask on at least a predetermined part of the useful layer so as to delineate at least one doped zone and at least one non-doped zone of said surface, one of said zones forming a stop after the superficial etching phase.

It is also an object of the invention to achieve a component comprising a suspended useful layer, attached by fixing means to a substrate, characterized in that it is obtained by a method according to the invention.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 3:
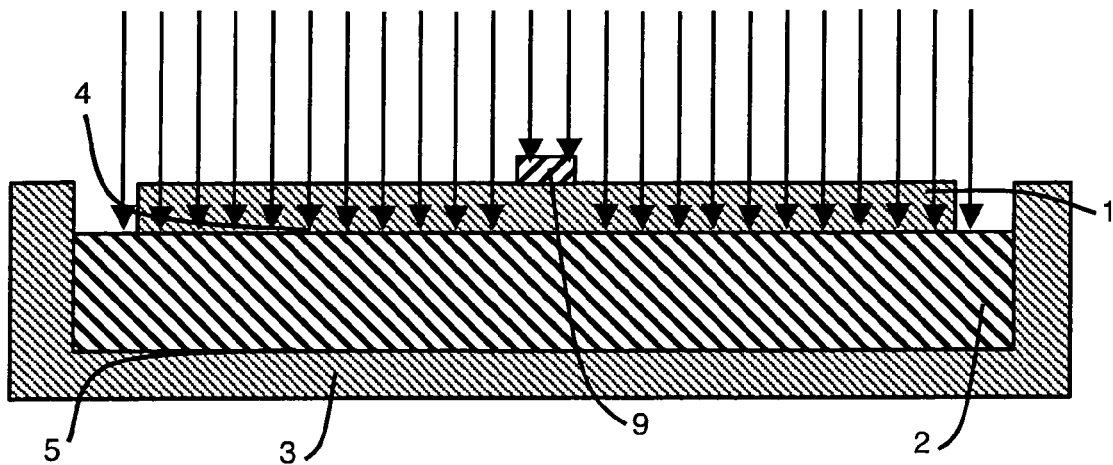
FIGS. 3 and 4 represent doping steps of a particular embodiment of a method according to the invention.

In FIG. 3, the useful layer 1, made of silicon, is initially attached by the sacrificial layer 2, made of silica, to the layer 3 forming the silicon substrate. As represented by the arrows in FIG. 3, a first step of a method for separating the useful layer 1 consists in doping the bottom surface 4 of the useful layer 1, arranged in contact with the sacrificial layer 2. Doping is performed through the useful layer 1.

The doped silicon surface has the property of etching more quickly than a non-doped silicon surface and, in addition, with a greater roughness. Thus, after complete etching of the sacrificial layer, a superficial etching phase of the surface 4 increases the roughness of the doped part of the surface (FIG. 8), which enables the adhesion forces between the opposite surfaces of the useful layer and of the layer forming the substrate to be reduced, and thus enables sticking of the useful layer and of the substrate to be prevented or at least limited.

Figure 8:
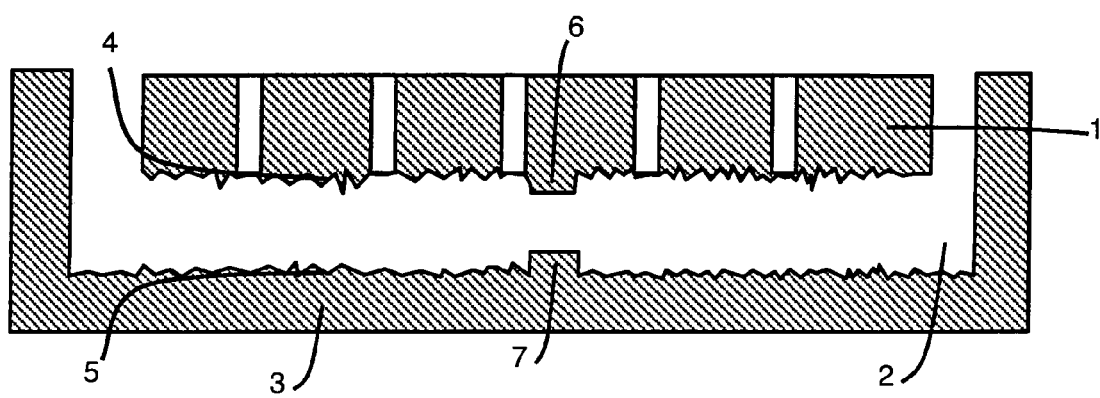

In the embodiment represented in FIG. 3, a mask 9 is deposited before doping on a central part of the top face of the useful layer 1. Thus, the mask 9 delineates a non-doped zone of the bottom surface 4 of the useful layer 1. As this non-doped zone etches more quickly than the doped zones, it constitutes a stop 6 at the end of the process, after the superficial etching phase (FIG. 8).

Figure 4:
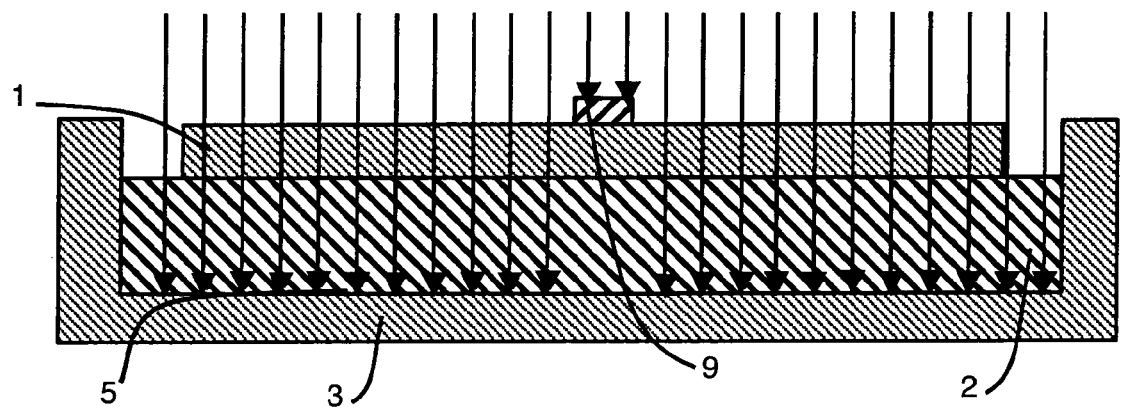
Figure 5:
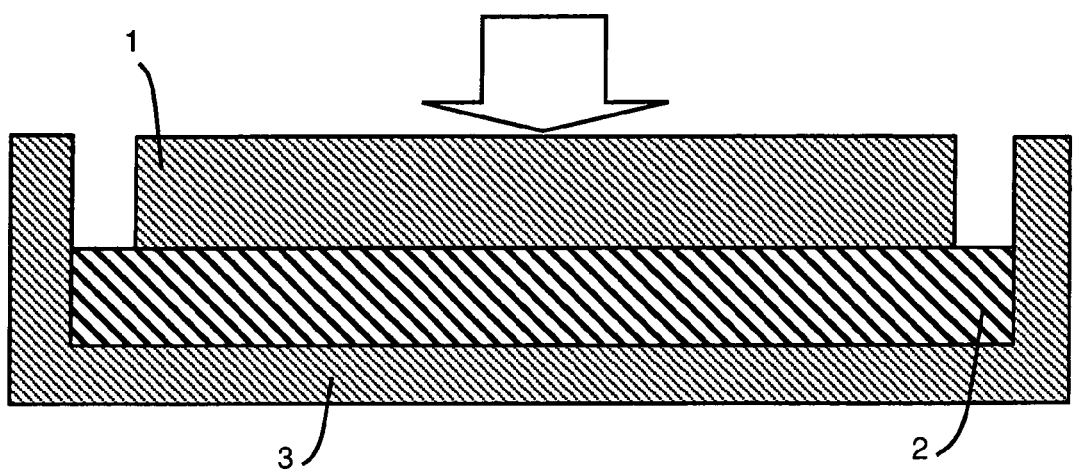
FIG. 5 represents an epitaxy step of a particular embodiment of a method according the invention.

In a second doping step of the method, represented in FIG. 4, the top surface 5 of the substrate layer 3 can be partially doped. As before, a mask 9 can delineate a non-doped central zone.

The doping steps are preferably performed by ion implantation, the doping elements being taken from the group comprising Boron, Phosphorus and Arsenic. The energy of the ions determines the depth of penetration in the material and thus enables the bottom surface 4 of the useful layer 1 and the top surface 5 of the layer 3 forming the substrate to be doped selectively. For example, a silicon surface intrinsically doped by boron (P type doping) and having a resistivity of 1 Ω.cm, is doped by boron by ion implantation with an energy of 45 keV and a dose of $5 \times 10^{15}$ atoms/cm$^2$ over a thickness of 0.3 µm, giving a resistivity of $1.5 \cdot 10^{-3}$ Ω.cm for the 0.3 µm thickness of the bottom surface 4 of the useful layer 1. Ion implantation of boron applied on the same type of silicon, through a useful layer 1 of silicon of 0.21 µm and a sacrificial layer 2 of silica of 0.4 µm, is performed, for example, with an energy of 240 keV and a dose of $2 \times 10^{14}$ atoms/cm$^2$, giving a resistivity of 0.01 Ω.cm over a thickness of 0.3 µm of the top surface 5 of the layer 3 forming the substrate.

The doping doses, energies and thicknesses can be adjusted to the thicknesses to be passed through, the required roughness, the required selectivity of etching of the doped silicon compared with the non-doped silicon and the thickness to be etched, which, on the other hand, depend on the etching solution used and on the etching time. The resistivity of the doped zones is typically 10 or 1,000 times greater than that of the non-doped zones, but this ratio can be higher or lower depending on the type of doping and the etching solutions used.

Moreover, too weak doping does not enable the required roughness to be obtained, whereas in the case of excessive doping, the material etches too quickly, and controlling the etching and roughness is thereby more difficult. However, excessive doping can be used to completely eliminate the doped part.

To improve the efficiency of the doping steps, the initial useful layer 1 (FIGS. 3 and 4) is preferably thinner than the final useful layer required (FIGS. 5 to 8). After doping, the thickness of the useful layer 1 can thus be increased by an epitaxy step, represented in FIG. 5, generally using the same material as that of the initial useful layer 1, i.e. typically silicon, but not necessarily the same type of doping. The resistivity of the materials can be respectively determined by a well controlled doping rate. The final thickness of the final useful layer 1 is typically about 20 µm, the initial useful layer being able, for example, to have a thickness of about 0.3 µm.

Figure 6:
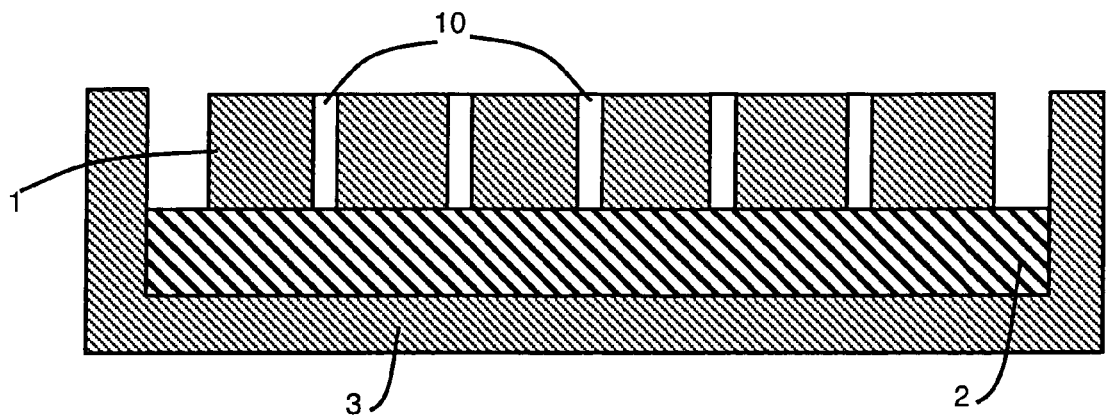
FIGS. 6 to 9 illustrate different etching steps of a particular embodiment of a method according the invention.

In FIG. 6, vertical apertures 10 are machined by etching in the useful layer 1 to successively enable the etching solutions of the sacrificial layer 2 and for superficial etching of the respective surfaces 4 and 5 of the useful layer 1 and of the substrate layer 3 to pass. The geometry and arrangement of the apertures 10 enable the dimensions of the suspended part of the useful layer to be defined. The useful layer 1 is suspended by fixing means that are not represented.

Figure 7:
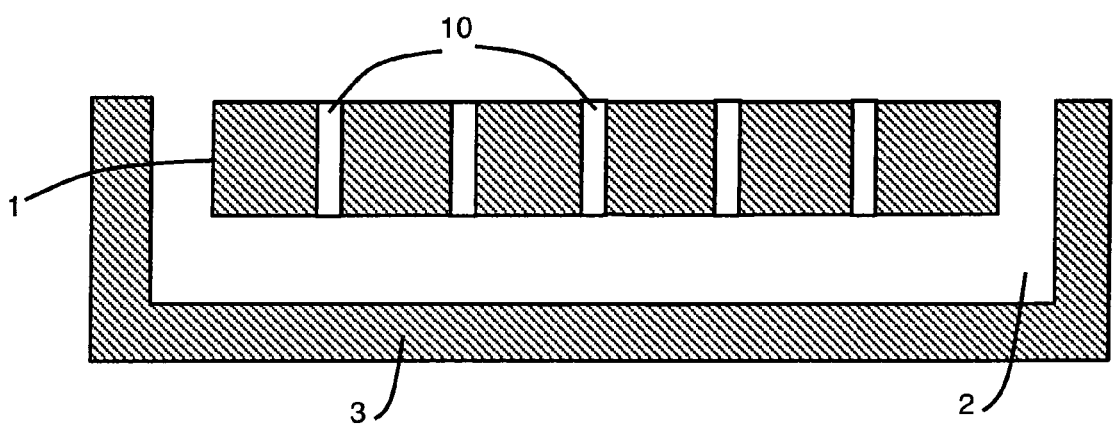

The sacrificial layer 2 is typically removed, as represented in FIG. 7, by etching with hydrofluoric acid-based solutions. Superficial etching is typically performed by a potassium solution and, preferably, by an aqueous solution containing $K_2Cr_2O_7$ and HF, for example of the "Secco" type. The thickness of the etched superficial layer is typically comprised between a few nanometers and 1 micron.

As illustrated in FIG. 8 (on a very enlarged scale), the superficial etching phase of the bottom surface 4 of the useful layer 1 and of the top surface 5 of the substrate layer increases the roughness of the doped zones. The non-doped zones, if any, remain flat and are etched less deeply than the doped zones. Thus, the non-doped zones form stops 6 and 7 arranged facing one another, keeping the two opposite surfaces 4 and 5 at a distance, which, in combination with the roughness of the opposite surfaces 4 and 5, enables the risk of sticking of the surfaces 4 and 5 to be further limited.

Generally, the bottom surface 4 of the useful layer 1 and the top surface 5 of the layer 3 forming the substrate intrinsically comprise doping elements of a predetermined type, i.e. N type or P type doping. The doping represented in FIGS. 3 and 4 is performed by the same type of doping elements and the non-doped zones therefore form (FIG. 8) the stops 6 and 7 at the end of the method. In an alternative embodiment, doping can be performed by doping elements of opposite type. In this case, the etching rate is lower in the zones doped by the doping elements of opposite type than in the non-doped zones, and the stops are then formed by the doped zones, at the end of the method.

Figure 1:
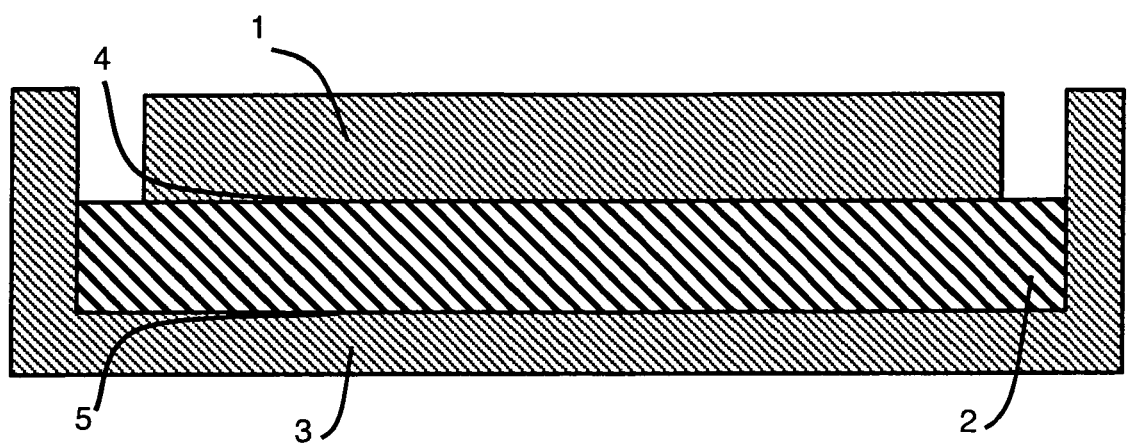
FIGS. 1 and 2 represent a component according to the prior art, respectively before and after etching of the sacrificial layer.
Figure 2:
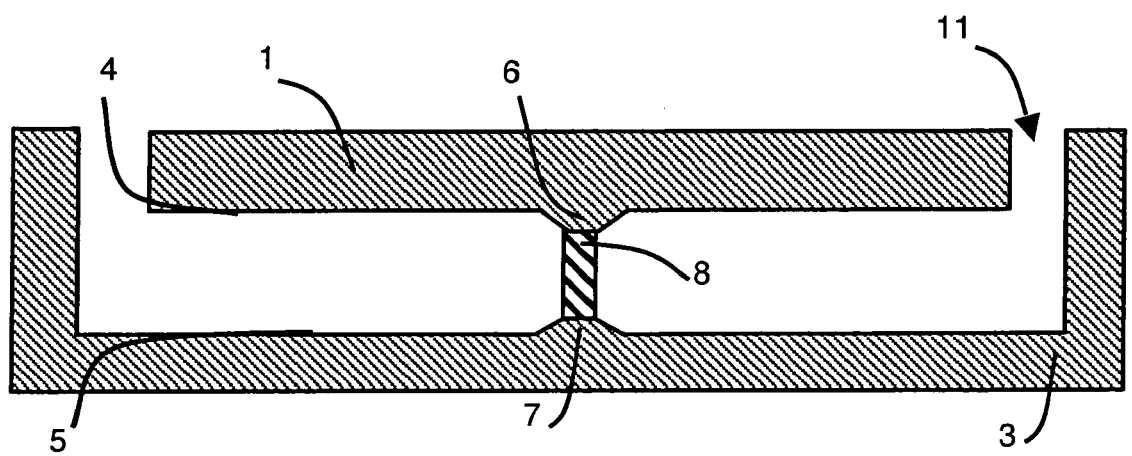
Figure 9:
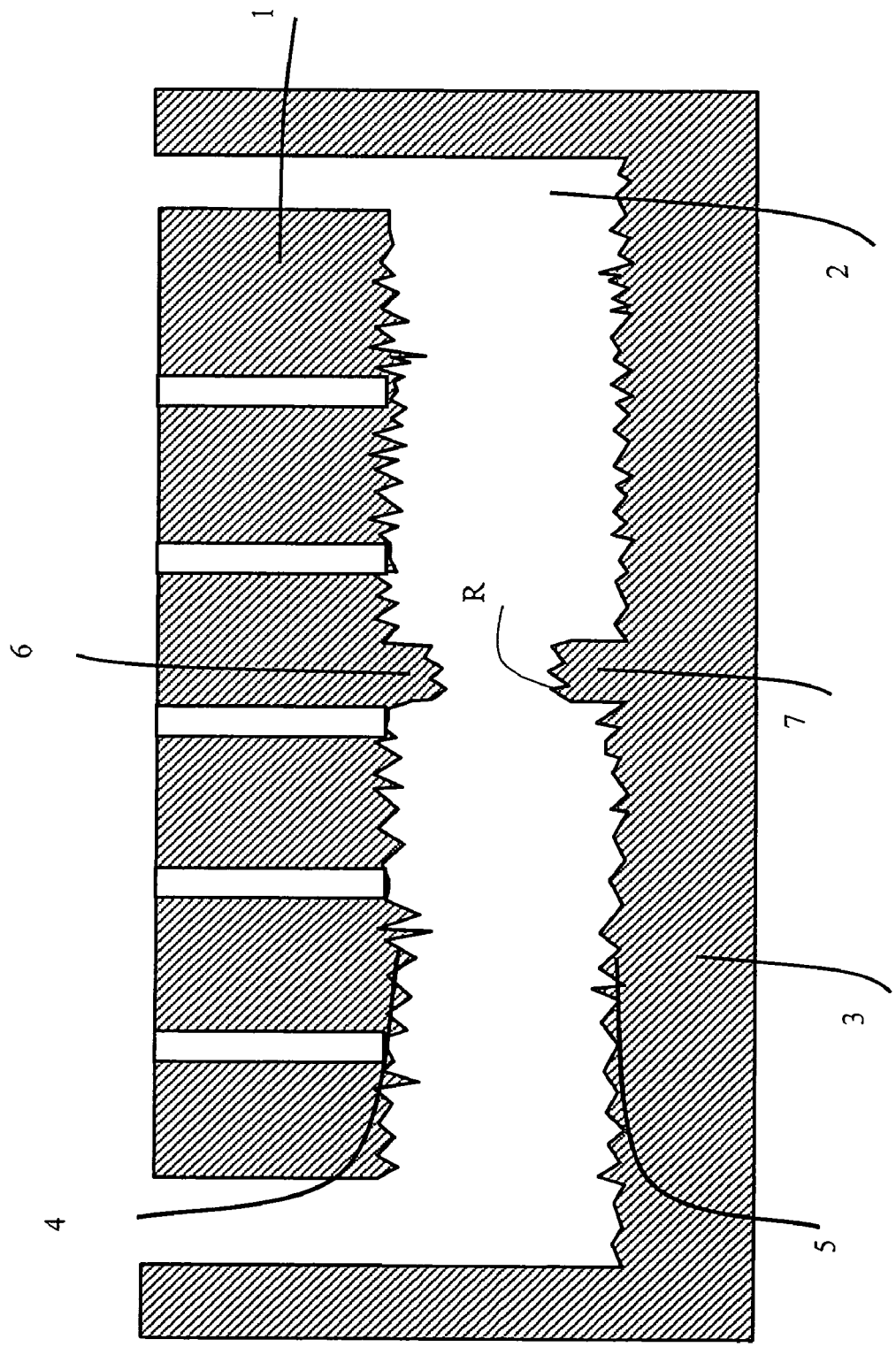

Whereas in the embodiment represented in FIG. 7, the whole of the sacrificial layer is removed after doping and before superficial etching of the surfaces 4 and 5, in a particular embodiment, after doping and before the superficial etching phase, the sacrificial layer 2 is only partially etched, leaving at least one spacer block 8 between the layer 3 forming the substrate and the useful layer 1, as represented in FIG. 2. As in the document U.S. Pat. No. 5,750,420, the superficial etching phase of the surfaces 4 and 5 then uses the spacer block 8 as a mask so as to form the stops 6 and 7 in the surfaces 4 and 5. At the same time, it increases the roughness of the doped free zones of the surfaces 4 and/or 5. In addition, after the spacer block 8 has been removed, an additional superficial etching phase of the surfaces 4 and 5 can be performed to increase the roughness of the doped surface of the stops 6 and/or 7 (as shown in FIG. 9, wherein R denotes the roughness of the doped surfaces of stops 6 and 7). This enables formation of stops of larger size than the flat stops without increasing the risk of sticking. Control of partial etching of the sacrificial layer 2 forming the spacer block 8 is thus made easier. Control of the dimensions of the spacer block is less critical than in the case described in the document U.S. Pat. No. 5,750,420 as the surface is rough.

The method applies particularly to thin sacrificial layers 2 of $SiO_2$ the thickness whereof is comprised between a few tens of nanometers and a few microns and preferably about 400 nanometers. For example, substrates 3 of the silicon on insulator (SOI) type are particularly suitable, in particular substrates obtained by separation by implantation of oxygen (SIMOX) preferably having an oxide thickness of 400 nanometers, or des substrates of the Unibond® type obtained by the Smart-Cut® method preferably having an oxide thickness of 1 to 3 microns.

The invention is not limited to the particular embodiments represented. In particular, doping of one of the opposite surfaces 4 and 5 only may be sufficient to prevent sticking of the surfaces. Doping of both of the surfaces is useful in certain conditions of use, for example in the case of high perpendicular accelerations or of large differences of potential between the two surfaces, etc. . . .

Moreover, in the case of doping of the two opposite surfaces 4 and 5, one of the surfaces can be completely doped, whereas doping of the other surface can be partial, for example by means of a mask 9. It is also possible to obtain a rough, substantially flat, surface facing at least one stop arranged on the other surface. Such a component can be obtained, for example, by removing, the mask 9 after the first doping step. In a general manner, the different doping steps can be performed using different masks. The stops 6 and 7 on the surfaces 4 and 5 can be of any number and arranged in any way.

In the prior art described in the document U.S. Pat. No. 5,750,420, the arrangement of the stop is determined by the arrangement of the spacer block remaining after partial etching of the sacrificial layer, an arrangement determined by the etching fronts. Unlike this prior art, the arrangement of the stop of the method according to the invention is controlled by the arrangement of the mask deposited on the useful layer. It is thus possible, for example by forming the mask by lithography, to control the arrangement and shape of the stops 6 and 7 very precisely. The mask 9 is delineated, for example, by photolithography, preferably having a resolution of about 0.3 micrometers. Photolithography makes it possible to delineate, with a good reproducibility, stops 6 and 7 of very precise lateral dimension, in the planes of the surfaces 4 and/or 5, for example with a lateral dimension of 2 micrometers, plus or minus 0.3 micrometers. The lateral dimension of the stops 6 and 7 defines the contact zone between the opposite surfaces of the useful layer 1 and of the substrate and thus determines the contact force between the useful layer 1 and the substrate. Control of the lateral dimension of the stops 6 and 7 thus enables the contact forces to be controlled.

Furthermore, the height of the stops 6 and 7, perpendicularly to the planes of the surfaces 4 and/or 5, does not significantly influence the contact between the useful layer 1 and the stops 6 and 7. The superficial etching time of the surfaces 4 and 5, which defines the height of the stops without modifying the lateral dimensions of the stops, is therefore not critical. Due to the doping contrast, etching is in fact highly selective.

The invention claimed is:

1. Method for separating a useful layer, initially attached by a sacrificial layer to a layer forming a substrate, the method comprising the following steps in order:
   depositing of a mask on at least a predetermined part of the useful layer;
   doping through the mask of at least a part of the surface of at least one of the layers in contact with the sacrificial layer, so as to delineate at least one doped zone and at least one non-doped zone of said part of the surface;
   at least partial etching of the sacrificial layer; and
   superficial etching of said part of the surface so as to increase the roughness of the doped zone of said part of the surface,
   one of said zones forming a stop after the superficial etching.

2. Method according to claim 1, wherein, said surface intrinsically comprising doping elements of a predetermined type, doping is performed by doping elements of the same type, the stop being formed by the non-doped zone.

3. Method according to claim 1, wherein, said surface intrinsically comprising doping elements of a predetermined type, doping is performed by doping elements of opposite type, the stop being formed by the doped zone.

4. Method according to claim 1, comprising, after doping, an epitaxy step increasing the thickness of the useful layer.

5. Method according to claim 1, wherein doping is performed by ion implantation, the doping elements being taken from the group comprising Boron, Phosphorus and Arsenic.

6. Method according to claim 1, wherein superficial etching is performed by an aqueous solution containing $K_2Cr_2O_7$ and HF.

7. Method according to claim 1, wherein the sacrificial layer is completely etched before the superficial etching phase of said surface.

8. Method according to claim 1, wherein the mask is delineated by photolithography.

9. Method according to claim 8, wherein the photolithography has a resolution of about 0.3 micrometers.

10. Component comprising a suspended useful layer, attached by fixing means to a substrate, obtained by a method according to claim 1.

11. Method for separating a useful layer, initially attached by a sacrificial layer to a layer forming a substrate, the method comprising the following steps in order:
    doping of at least a part of the surface of at least one of the layers in contact with the sacrificial layer;
    at least partial etching of the sacrificial layer so as to leave at least one spacer block between the layer forming the substrate and the useful layer,
    superficial etching of said surface so as to increase the roughness of the doped part of the surface,
       wherein the superficial etching of said surface uses the spacer block as mask, so as to form at least one stop in said surface;
    removal of said spacer block; and
    an additional superficial etching of said surface so as to increase the roughness of the surface of the stop.

12. The method according to claim 11, further comprising depositing of a mask on at least a predetermined part of the useful layer.

* * * * *